(12) United States Patent
Kawamoto

(10) Patent No.: US 7,859,345 B2
(45) Date of Patent: Dec. 28, 2010

(54) SEMICONDUCTOR INTEGRATED CIRCUIT

(75) Inventor: Takashi Kawamoto, Kodaira (JP)

(73) Assignee: Renesas Electronics Corporation, Kawasaki-shi (JP)

(*) Notice: Subject to any disclaimer, the term of this patent is extended or adjusted under 35 U.S.C. 154(b) by 20 days.

(21) Appl. No.: 12/337,459

(22) Filed: Dec. 17, 2008

(65) Prior Publication Data

US 2009/0160565 A1 Jun. 25, 2009

(30) Foreign Application Priority Data

Dec. 21, 2007 (JP) ............................. 2007-329488

(51) Int. Cl.
*H03L 7/093* (2006.01)
(52) U.S. Cl. ........................................ 331/17; 331/1 A
(58) Field of Classification Search .................... 331/17, 331/1 A
See application file for complete search history.

(56) References Cited

U.S. PATENT DOCUMENTS

| | | | |
|---|---|---|---|
| 5,424,689 A * | 6/1995 | Gillig et al. .................... | 331/17 |
| 5,892,958 A | 4/1999 | Nagashige et al. | |
| 7,057,465 B2 * | 6/2006 | Wakayama .................. | 331/16 |
| 7,283,004 B2 * | 10/2007 | Guenais ........................ | 331/17 |
| 2005/0134391 A1 | 6/2005 | Kimura et al. | |

FOREIGN PATENT DOCUMENTS

| | | |
|---|---|---|
| JP | 06-276090 A | 9/1994 |
| JP | 2005-184771 A | 7/2005 |

OTHER PUBLICATIONS

Wei-Ta Chen et al., "A Spread Spectrum Clock Generator for SATA-II", 2005 IEEE International Symposium Circuits and Systems, May 23-26, 2005, pp. 2643-2646.

* cited by examiner

*Primary Examiner*—Joseph Chang
(74) *Attorney, Agent, or Firm*—Miles & Stockbridge P.C.

(57) ABSTRACT

The semiconductor integrated circuit incorporates a PLL circuit including a phase-frequency comparator 1, first and second charge pumps 2 and 3, a loop filter 4, a voltage-control oscillator 5 and a divider 6. The operation mode of the PLL circuit includes a standby state where locking is stopped, a lock response operation where locking is started and a steady lock operation where the locking started by the lock response operation is continued. In the steady lock operation, setting is made so that the second charge pump 3 is smaller in charge/discharge current than the first charge pump 2. The first and second charge pumps 2 and 3 charge and discharge the loop filter 4 in response to outputs of the phase-frequency comparator 1 in reverse to each other in phase. In the lock response operation where locking is started, the second charge pump 3 is stopped from charging and discharging in reverse in phase.

13 Claims, 5 Drawing Sheets

SEMICONDUCTOR INTEGRATED CIRCUIT

CLAIM OF PRIORITY

The Present application claims priority from Japanese application JP 2007-329488 filed on Dec. 21, 2007, the content of which is hereby incorporated by reference into this application.

FIELD OF THE INVENTION

The present invention relates to a semiconductor integrated circuit with a built-in phase-locked loop (PLL) circuit. Particularly, it relates to a technique which enables a loop filter to be formed on a chip, materializes a high-speed response, and is useful for achieving a sufficient noise suppression effect after lock.

BACKGROUND OF THE INVENTION

Conventionally, a phase-locked loop (PLL) circuit has been incorporated in a semiconductor integrated circuit. This type of PLL circuits serve to produce a clock signal for allowing a logic circuit such as a large-scale logic integrated circuit to operate, and to produce a clock circuit used for sending and receiving actions in an integrated circuit for communications or the like.

JP-A-2005-184771 discloses a means which allows a loop filter of a built-in PLL circuit of a semiconductor integrated circuit for wireless communications to be formed on a chip. According to such means, two charge pump circuits for charging and discharging a filter capacitance are used; one charge pump circuit is smaller than the other in electric current flowing therethrough. Further, the reversed phase operation is performed so that the charging current source for one of the charge pump circuits and the discharging current source for the other charge pump circuit are made to work concurrently. Thus, a zero-point frequency as gained in case that the filter capacitance is made smaller can be achieved depending on the current ratio of the two current sources. It becomes possible to form the loop filter of a PLL circuit on the chip.

JP-A-6-276090 discloses a PLL circuit which supplies an output of a phase comparator to a voltage-control oscillator through a charge pump and a loop filter, which is provided with an additional charge pump for rapidly charging and discharging the capacitance of the loop filter for achieving a high-speed response and a sufficient after-lock noise suppression effect. In a high-speed mode, both the charge pumps, i.e. originally-provided pump and additional one, rapidly charge and discharge the capacity, whereby a high-speed response is materialized. After lock, the additional charge pump is turned off, and thus the PLL circuit is put in a low-noise lock state.

Now, U.S. Pat. No. 5,892,958 discloses a hard disk drive that a controller LSI is controlled into a sleep mode of small power consumption or an active mode of large power consumption depending on whether or not a main CPU accesses a file. The power control circuit stops supplying an internal clock pulse in the sleep mode, whereas it resumes supplying the internal clock pulse in the active mode.

Further, a spread spectrum clock generator for serial ATA interface (SSCG) including a fractional PLL circuit which toggles between two frequency division ratios of a divider according to an output of a delta sigma modulator is suggested by Wei-Ta Chen et al. "A Spread Spectrum Clock Generator for SATA-II", 2005 IEEE International Symposium Circuits and Systems, 23-26 May 2005, PP. 2643-2646.

According to Wei-Ta Chen et al., the PLL circuit tggles between two frequency division ratios (73 and 75) of the dual modulus divider according to the output of the delta sigma modulator. In this way, a spread spectrum clock generator (SSCG) modulates a clock signal in frequency and lowers the peak power of fundamental and harmonic waves of the clock for reduction in undesired radiations like EMI in electronic devices. In regard to such generator, the total energy is unchanged, but clock signals are spread over a wide frequency bandwidth with the clock signal amplitudes and signal edge waveforms maintained. Therefore, the peak energy can be reduced. Also, it has been reported in the document by Wei-Ta Chen et al. that a delta sigma modulator of MASH type with a primary delta sigma modulator of multiple stages is used for the purpose of reducing quantization noise in outputs of the delta sigma modulator. In case of a typical PLL circuit which takes only an integer as its frequency division ratio, the frequency resolution of the phase-locked loop is equal to the reference frequency $f_{REF}$, and therefore a small reference frequency $f_{REF}$ is needed for fine frequency resolution. As a result, the loop frequency bandwidth is made smaller. A narrow loop frequency bandwidth is not desirable because it makes a switching time longer. Further, with a typical PLL circuit, phase noise of a voltage-control oscillator (VCO) thereof cannot be suppressed sufficiently, and such PLL circuit is easily affected by noise from the outside. In contrast, a fractional synthesizer incorporating a fractional PLL circuit has been developed, which has a finer frequency resolution than the reference frequency $f_{REF}$. In a fractional-N divider, the frequency division ratio is changed from an integer N to another integer N+1 periodically. As a result, the average frequency division ratio is increased by the duty ratio of frequency division of N+1 rather than N. Now, it is noted that SSCG is an abbreviation for "Spread Spectrum Clock Generator", and EMI is an abbreviation for "Electromagnetic Interference". Further, MASH is an abbreviation for "Multistage noise Shaping Technique". ATA is an abbreviation for "Advanced Technology Attachment".

SUMMARY OF THE INVENTION

As has been known well, a PLL circuit is used for a record-and-reproduction unit of a hard disk drive (HDD). A read signal read out of a magnetic disk of a record-and-reproduction unit by a magnetic head is amplified in a preamplifier and a variable-gain amplifier, and on receipt of supply of an output from a PRML decoder, a PLL circuit reproduces, from the output of the decoder, a clock signal for deciding the time of peak detection of the decoder. Here, PRML is an abbreviation for "Partial Response Mostly Likelihood", which is a decoding technique.

PLL circuits are adopted for not only such record-and-reproduction unit but also interface units, mobile phone terminals, and various kinds of electronic devices in connection with wireless communication equipment. An interface unit is a device for performing bidirectional data transfer between a storage medium such as an optical disk device or a hard disk drive and a computer such as a personal computer, in which a clock used for data transfer is produced by a PLL circuit.

Also, in wireless communication devices including mobile phone terminals, a PLL circuit produces carrier clocks used as a transmitter local signal and a receive local signal.

On the other hand, in a hard disk drive (HDD), a controller LSI is switched between the active mode of large power consumption and sleep mode of small power consumption depending on whether or not a main CPU accesses a file, whereby the action of the PLL circuit which produces an internal clock pulse is switched. In the active mode, in which HDD device makes an access to a file, an output signal of the decoder is supplied to an input of the PLL circuit, and then the PLL circuit locks an input signal. However, in the sleep mode (standby mode or idle mode) in which the HDD device does not make access to a file, no effective output signal from the decoder is supplied to the input of the PLL circuit. As a result, the PLL circuit does not lock an input signal.

In the record-and-reproduction unit of an HDD device or the like, it is required to lock (or recover) a reproduction clock signal produced by the PLL circuit, at a high speed at the time of changing the operation mode from the sleep mode (standby mode) to the active mode (i.e. the mode of having access). Further, in these days, devices of serial ATA type have been in the spotlight as an interface unit for data transfer between a storage medium such as an HDD device and a personal computer. To meet the standards of the serial ATA, a serial ATA interface unit including a PLL circuit is needed to conform to the specification of high-speed recovery from the standby state within ten microseconds. Hence, to achieve such high-speed recovery, the voltage-control oscillator (VCO) of the PLL circuit is required to keep oscillating also in the sleep mode (standby mode) of the HDD device in which the PLL circuit locks nothing. As a result, in the HDD device in the standby state, the voltage-control oscillator of the PLL circuit continues consuming an operating current, and therefore the life of a battery can be shortened in regard to a personal computer including a serial ATA interface unit.

As to mobile phone terminals, the transition time of the standby state to an in-service mode is defined by the communication standards. Therefore, a PLL circuit as incorporated in a mobile phone terminal is required to achieve high-speed lock and meet requirements concerning noise and other characteristics, and further to have a reduced mounting area in terms of cost cutting. However, in fact, as long as the transition time and noise characteristics are achieved, a loop filter of a PLL circuit cannot be formed in a semiconductor integrated circuit in on-chip style, and there is no other choice but to form the loop filter as an external part. As a result, the mounting area and the number of parts are increased, which leads to the rise in the cost.

As has been known well, the lock time (settling time) $T_L$ of a PLL circuit is in reverse proportion to a natural angular frequency ωn as shown by:

$$T_L \approx 2\pi/\omega n.$$

Also, as has been known well, the natural angular frequency ωn of the PLL circuit is approximately in reverse proportion to the value of a filter capacitance of the loop filter of the PLL circuit.

Therefore, the lock time (settling time) $T_L$ must be shortened for achievement of high-speed lock in a PLL circuit. For this purpose, it is required to make larger the natural angular frequency ωn, and consequently it is necessary to widen the frequency bandwidth of the loop filter. However, widening the frequency bandwidth of the loop filter of a PLL circuit deteriorates the noise characteristics of the PLL circuit. Particularly, in regard to a fractional PLL incorporated in a spread spectrum clock generator used in a serial ATA interface unit, widening the frequency bandwidth of the loop filter causes quantization noise of the delta sigma modulator to leak into an output of the voltage-control oscillator, whereby the noise characteristics are deteriorated.

As described in JP-A-2005-184771, using two charge pump circuits to charge and discharge the filter capacitance with different values of current can make smaller the filter capacitance according to the current ratio, and thus the loop filter of a PLL circuit can be formed on a chip. However, as to the loop filter of the PLL circuit as described in JP-A-2005-184771, the frequency bandwidth of the loop filter is fixed. Therefore, it is impossible to both materialize high-speed lock and meet the requirement for noise characteristics as described in JP-A-6-276090.

Further, it is possible to achieve both a high-speed response and a sufficient noise suppression effect in case that in the high-speed mode, both of charge pumps, i.e. originally-provided pump and additional one, rapidly charge and discharge the capacity, and the after lock, the additional charge pump is turned off, thereby to bring the PLL circuit into the low-noise lock state as described in JP-A-6-276090. However, as to the PLL circuit as described in JP-A-6-276090, both the originally-provided and additional charge pumps are arranged so as to work in the same phase in response to an output signal of the phase comparator, and are not arranged so as to be reverse in phase to each other for the purpose of forming the loop filter of a built-in PLL circuit on the chip as described in JP-A-2005-184771. Therefore, the PLL circuit as described in JP-A-6-276090 can achieve a high-speed response and an after-lock sufficient noise suppression effect, however it is impossible to form the loop filter of the PLL circuit on the chip as in JP-A-2005-184771.

The invention was made as a result of the examination by the inventors as stated above prior to the invention.

It is an object of the invention to provide a semiconductor integrated circuit having a phase-locked loop circuit (PLL circuit) of built-in type, which enables a loop filter thereof to be formed on a chip, and achieves a high-speed response and a sufficient after-lock noise suppression effect.

The above and other objects of the invention and novel features thereof will be apparent from the description hereof and the accompanying drawings.

Of the embodiments disclosed hereby, the preferred ones will be outlined below.

A representative semiconductor integrated circuit according to the invention incorporates a phase-locked loop circuit including a phase-frequency comparator (1), a first charge pump (2), a second charge pump (3), a loop filter (4), a voltage-control oscillator (5) and a divider (6). The operation mode of the PLL circuit includes a standby state in which locking is stopped, a lock response operation in which locking is started, and a steady lock operation in which the locking started by the lock response operation is continued. In the steady lock operation, setting is made so that charge/discharge current of the second charge pump (3) is smaller than charge/discharge current of the first charge pump (2) in current value, and the first and second charge pumps (2, 3) respond to outputs of the phase-frequency comparator to charge and discharge the loop filter (4) in reverse to each other in phase. In the lock response operation in which locking is started, the second charge pump (3) is stopped from charging and discharging the loop filter (4) in reverse in phase (see FIGS. 1 and 2).

The preferred ones of the embodiments disclosed hereby have the following effect in brief.

The invention can provide a semiconductor integrated circuit with a built-in PLL circuit which enables a loop filter to be formed on a chip, and achieve a high-speed response and a sufficient after-lock noise suppression effect.

DETAILED DESCRIPTION OF THE PREFERRED EMBODIMENTS

1. Summary of the Preferred Embodiments

Figure 1:
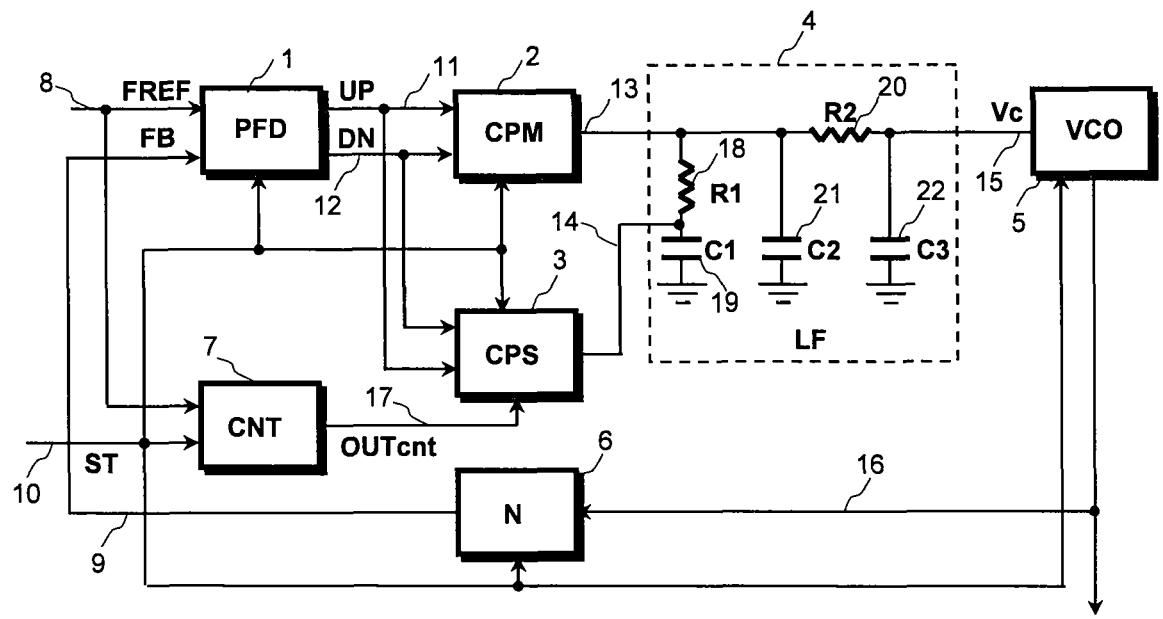
FIG. 1 is an illustration for explaining the configuration of a PLL circuit integrated into a semiconductor integrated circuit in on-chip style according to an embodiment of the invention.

First, the preferred embodiments of the invention herein disclosed will be outlined. The reference numerals for reference to the drawings, which are accompanied with paired round brackets here, only exemplify what the concepts of components referred to by the numerals, characters and signs contain.

[1] A semiconductor integrated circuit according to a preferred embodiment of the invention has a built-in phase-locked loop circuit including a phase-frequency comparator (1), a first charge pump (2), a second charge pump (3), a loop filter (4), a voltage-control oscillator (5) and a divider (6).

The phase-frequency comparator compares a reference signal (8) with a feedback signal (9) made by an output signal of the divider in phase difference, and outputs a first output signal (11) and a second output signal (12) as phase comparison output signals resulting from the comparison.

The first charge pump (2) and second charge pump (3) are made operable to charge and discharge the loop filter (4) in response to the first output signal (11) and second output signal (12) from the phase-frequency comparator respectively.

Outputs of the first charge pump (2) and the second charge pump (3) are connected to the loop filter (4).

The operation mode of the PLL circuit includes a standby state in which locking is stopped, a lock response operation in which locking is started, and a steady lock operation in which the locking started by the lock response operation is continued.

In the steady lock operation of the PLL circuit in which the phase of the reference signal (8) and the phase of the feedback signal (9) from the divider are kept in a state of being locked in a predetermined relation, setting is made so that charge/discharge current of the output of the second charge pump (3) is smaller than charge/discharge current of the output of the first charge pump (2) in current value.

In the operation mode of the steady lock operation of the PLL circuit, the first charge pump (2) and second charge pump (3) respond to the first output signal (11) and second output signal (12) of the phase-frequency comparator to charge and discharge the loop filter (4) in reverse to each other in phase.

Figure 2:
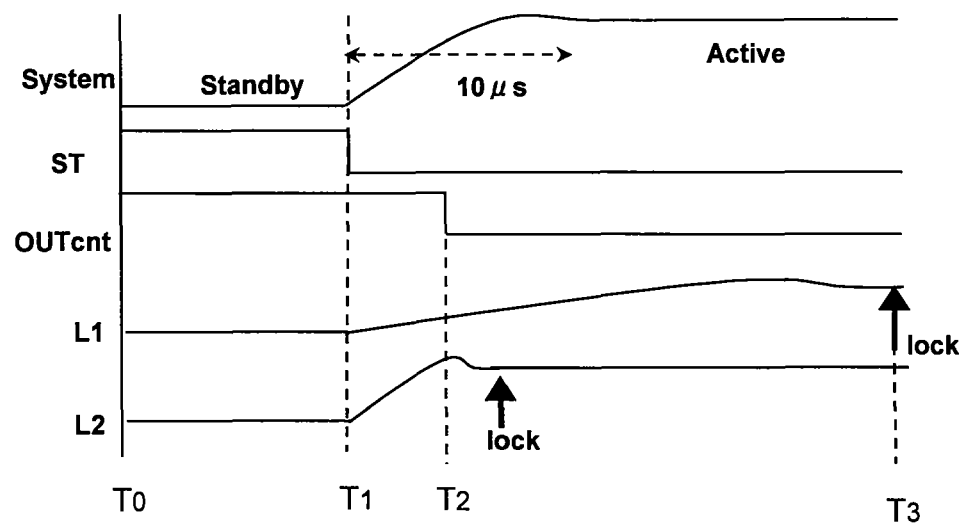
FIG. 2 is a time chart showing an operation sequence of the standby state, high-speed lock response operation and low-noise steady lock operation of the PLL circuit integrated in on-chip style as in FIG. 1.

In the lock response operation in which locking is started, the second charge pump (3) is stopped from charging and discharging the loop filter (4) in reverse in phase to the charging and discharging of the loop filter (4) by the first charge pump (2) (see FIGS. 1 and 2).

According to the embodiment, in the steady lock operation of the PLL circuit, the first and second charge pumps (2, 3) charge and discharge the loop filter (4) with currents different in value and reverse in phase to each other. Therefore, the capacitance of the loop filter can be formed on a chip as in the case of the PLL circuit described in JP-A-2005-184771.

In addition, at this time, low-noise characteristics in the steady lock operation of the PLL circuit can be achieved by setting the frequency bandwidth of the loop filter (4) to be relatively narrow.

Further, in the lock response operation in which locking is started, the second charge pump (3) is stopped from weakly charging/discharging the loop filter (4) in reverse in phase with a small charge/discharge current, and the first charge pump (2) strongly charges/discharges the loop filter (4) with a large charge/discharge current. As a result, an oscillation control voltage (Vc) of the loop filter (4) supplied to the voltage-control oscillator (5) can be changed at a high speed, whereby high-speed response of the PLL circuit can be achieved.

In the semiconductor integrated circuit according to a preferred embodiment, in the standby state of the operation mode of the PLL circuit, at least the phase-frequency comparator (1), first charge pump (2), second charge pump (3), and divider (6) of the PLL circuit are controlled to be in cutoff states.

A control signal (10) for changing the operation mode of the PLL circuit from the standby state to the lock response operation is supplied to the PLL circuit.

At least the phase-frequency comparator (1), first charge pump (2) and divider (6) of the PLL circuit are released from the cutoff states and start operating in response to supply of the control signal (10) to the PLL circuit.

The PLL circuit further includes a controller (7) which produces a control output signal (17) changing in level behind by a predetermined delay time ($T_2-T_1$) in response to a change in level of the control signal (10).

In response to a change in level of the control output signal (17) produced by the controller (7), stop of the second charge pump (3) charging and discharging in reverse in phase in the lock response operation is terminated, and the charging and discharging by the second charge pump (3) in reverse in phase is started in the steady lock operation.

According to the preferred embodiment, in the standby state, many circuits in the PLL circuit are controlled to be in cutoff states. Therefore, the current consumption in the standby state can be reduced. In addition, as the PLL circuit includes the controller (7), the control output signal (17) for changing the mode from the lock response operation to the steady lock operation can be produced from the control signal (10) for changing the operation mode from the standby state to the lock response operation, and made to develop at an output of the controller (7).

In the semiconductor integrated circuit according to a more preferred embodiment, the PLL circuit further includes a modulator (23) connected with the divider (6).

The divider (6) varies in division factor between difference values responding to an output of the modulator (23), and thus the PLL circuit operates, as a fractional PLL that an average division factor of the divider (6) is constituted by a sum of an integer part and a decimal part, in a fractional PLL operation mode.

According to the more preferred embodiment, it is unnecessary to extremely widen the frequency bandwidth of the loop filter for the purpose of actualizing high-speed lock in the fractional PLL. Therefore, the deterioration of the noise characteristics caused by the leakage of quantization noise of the divider (6) into the output of the voltage-control oscillator (5) can be reduced.

Figure 7:
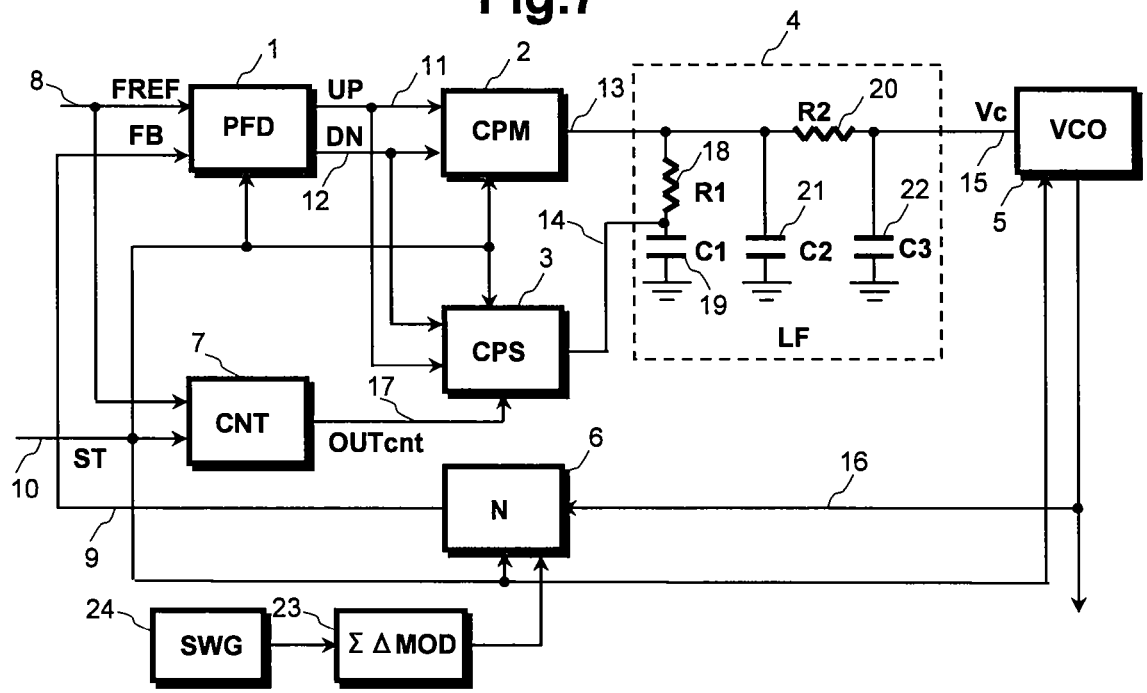
FIG. 7 is a diagram showing a configuration of a fractional PLL circuit for constituting a spread spectrum clock generator used in a serial ATA interface unit.

In the semiconductor integrated circuit according to another more preferred embodiment, the PLL circuit which operates in the fractional PLL operation mode constitutes a spread spectrum clock generator (SSCG) used in an on-chip serial ATA interface unit (see FIG. 7).

Further, in a preferred embodiment, the semiconductor integrated circuit including the serial ATA interface unit can be connected between a storage disk device (29, 30) and a host device (32).

Figure 10:
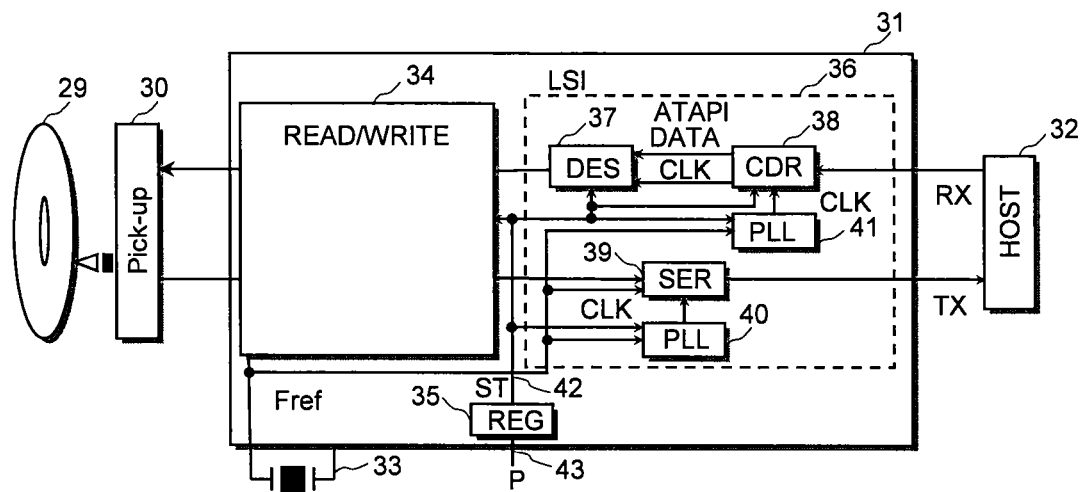
FIG. 10 is a diagram showing a configuration of an interface unit according to another embodiment of the invention, which is connected between a peripheral device and a host computer.
Figure 11:
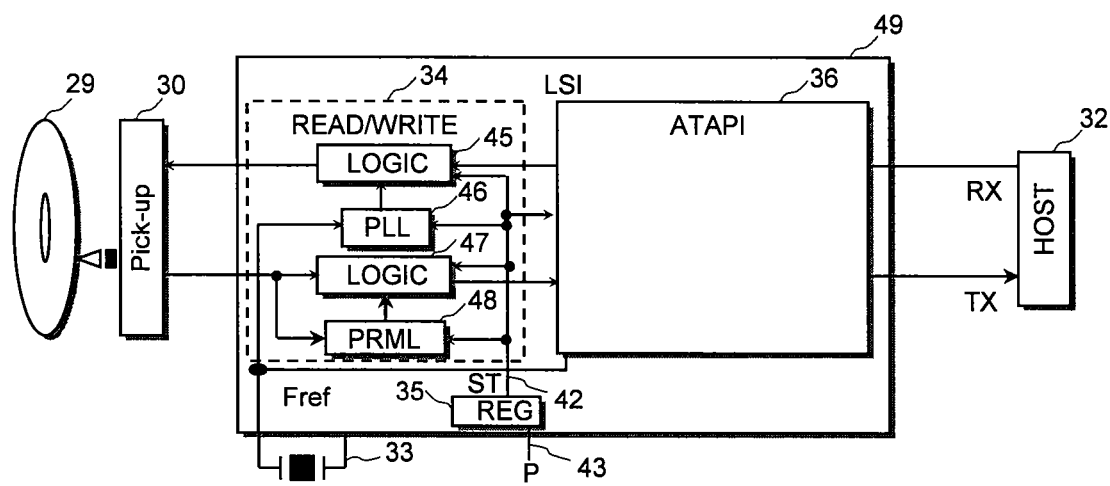
FIG. 11 is a diagram showing a configuration of a record-and-reproduction unit according to another embodiment of the invention, which is connected between a peripheral device and a host computer.

The semiconductor integrated circuit reads a read signal from the storage disk device to supply read data to the host device, and accepts write data from the host device to supply a write signal to the storage disk device (see FIGS. 10 and 11).

In the semiconductor integrated circuit according to a specific embodiment, the first output signal (11) and second output signal (12) of the phase-frequency comparator can be supplied to a charge control input terminal and a discharge control input terminal of the first charge pump (2), respectively (see FIG. 1).

The second output signal (12) and first output signal (11) of the phase-frequency comparator can be supplied to charge and discharge control input terminals of the second charge pump (3), respectively.

In the semiconductor integrated circuit according to a most specific embodiment, an output of the first charge pump (2) is connected to one end (13) of a resistance (18) of the loop filter (4) and an output of the second charge pump (3) is connected to the other end (14), and a capacitance (19) is connected between the other end (14) of the resistance (18) and a ground potential (see FIG. 1).

In the semiconductor integrated circuit according to another most specific embodiment, in the lock response operation in which locking is started, the first charge pump (2) and second charge pump (3) charge and discharge the loop filter (4) in phase with each other.

[2] A semiconductor integrated circuit according to a preferred embodiment in connection with another aspect of the invention is a semiconductor integrated circuit for interface connectable between a storage disk device (29, 30) and a host device (32).

The semiconductor integrated circuit has: a record-and-reproduction unit (34) arranged to be connectable with the storage disk device (29, 30) and including a first PLL circuit (46); and an interface unit (36) arranged to be connectable with the host device (32) and including second PLL circuits (40, 41) (see FIG. 10).

The semiconductor integrated circuit reads a read signal from the storage disk device to supply read data to the host device, and accepts write data from the host device to supply a write signal to the storage disk device (see FIGS. 10 and 11).

The record-and-reproduction unit (34) of the semiconductor integrated circuit reads the read signal from the storage disk device to supply the write signal to the storage disk device (see FIG. 11).

The interface unit (36) of the semiconductor integrated circuit accepts the write data from the host device to supply the write signal to the storage disk device (see FIG. 10).

Figure 9:
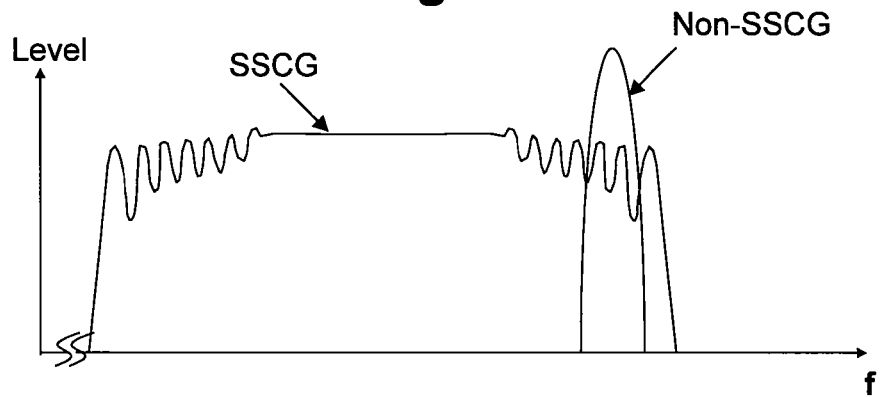
FIG. 9 is a diagram showing frequency spectra of the PLL output signal PLLOUT produced by the fractional PLL circuit included in the spread spectrum clock generator shown in FIG. 7.

The first PLL circuit (46) and second PLL circuits (40, 41) each include a phase-frequency comparator (1), a first charge pump (2), a second charge pump (3), a loop filter (4), a voltage-control oscillator (5) and a divider (6) (see FIG. 9).

The phase-frequency comparator of each PLL circuit compares a reference signal (8) with a feedback signal (9) made by an output signal of the divider in phase difference, and outputs a first output signal (11) and a second output signal (12) as phase comparison output signals resulting from the comparison.

The first charge pump (2) and second charge pump (3) of each PLL circuit are made operable to charge and discharge the loop filter (4) in response to the first output signal (11) and second output signal (12) from the phase-frequency comparator respectively.

Outputs of the first charge pump (2) and second charge pump (3) of each PLL circuit are connected to the loop filter (4).

The operation mode of each PLL circuit includes a standby state in which locking is stopped, a lock response operation in which locking is started, and a steady lock operation in which the locking started by the lock response operation is continued.

In the steady lock operation of each PLL circuit, in which the phase of the reference signal and the phase of the feedback signal from the divider are kept in a state of being locked in a predetermined relation, setting is made so that charge/discharge current of the output of the second charge pump is smaller than charge/discharge current of the output of the first charge pump in current value.

In the steady lock operation of each PLL circuit, the first charge pump (2) and second charge pump (3) respond to the first output signal (11) and second output signal (12) of the phase-frequency comparator to charge and discharge the loop filter (4) in reverse to each other in phase.

In the lock response operation of each PLL circuit in which locking is started, the second charge pump (3) is stopped from charging and discharging the loop filter (4) in reverse in phase to the charging and discharging of the loop filter (4) by the first charge pump (2) (see FIGS. 1 and 2).

The second PLL circuits (40, 41) each include a modulator (23) connected with the divider (6) thereof.

The divider (6) of the second PLL circuit varies in division factor between difference values responding to an output of the modulator (23), and thus the second PLL circuit operates, as a fractional PLL that an average division factor of the divider (6) is constituted by a sum of an integer part and a decimal part, in a fractional PLL operation mode (see FIG. 7).

In the semiconductor integrated circuit according to a preferred embodiment, in the standby state of the operation mode of each PLL circuit, at least the phase-frequency comparator (1), first charge pump (2), second charge pump (3) and divider (6) of the PLL circuit are controlled to be in cutoff states.

A control signal (10) for changing the operation mode of each PLL circuit from the standby state to the lock response operation is supplied to the PLL circuit.

At least the phase-frequency comparator (1), first charge pump (2) and divider (6) of each PLL circuit are released from the cutoff states and start operating in response to supply of the control signal (10) to the PLL circuit.

Each PLL circuit further includes a controller (7) which produces a control output signal (17) changing in level behind by a predetermined delay time $(T_2-T_1)$ in response to a change in level of the control signal (10).

As to each PLL circuit, in response to a change in level of the control output signal produced by the controller, stop of the second charge pump charging and discharging in reverse in phase in the lock response operation is terminated, and the charging and discharging by the second charge pump in reverse in phase is started in the steady lock operation.

In the semiconductor integrated circuit according to a more preferred embodiment, the first output signal (11) and second output signal (12) of the phase-frequency comparator can be supplied to charge and discharge control input terminals of the first charge pump (2) of each PLL circuit respectively (see FIG. 1).

The second output signal (12) and first output signal (11) of the phase-frequency comparator can be supplied to charge and discharge control input terminals of the second charge pump (3) of each PLL circuit respectively.

Further, in the semiconductor integrated circuit according to a more preferred embodiment, an output of the first charge pump (2) of each PLL circuit is connected to one end (13) of a resistance (18) of the loop filter (4), an output of the second charge pump (3) of the PLL circuit is connected to the other end (14), and a capacitance (19) is connected between the other end (14) of the resistance (18) and a ground potential (see FIG. 1).

Further, the semiconductor integrated circuit according to another more preferred embodiment further has: a spread spectrum clock generator (SSCG) used in the interface unit (36) arranged as a serial ATA interface unit, wherein the spread spectrum clock generator includes the second PLL circuits (40, 41) (see FIG. 7).

In a semiconductor integrated circuit according to a more specific embodiment, in the lock response operation in which locking is started, the first charge pump (2) and second charge pump (3) charge and discharge the loop filter (4) in phase with each other.

2. Further Detailed Description of the Preferred Embodiments

Now, details of the embodiments will be described.

<<Configuration of PLL Circuit>>

FIG. 1 is a diagram for explaining the configuration of a PLL circuit integrated into a semiconductor integrated circuit in on-chip style according to an embodiment of the invention.

The PLL circuit integrated in on-chip style according to an embodiment of the invention as shown in FIG. 1 includes: a phase-frequency comparator (PFD) 1; a first charge pump (CPM) 2; a second charge pump (CPS) 3; a loop filter (LF) 4; a voltage-control oscillator (VCO) 5; and a divider (N) 6. The phase-frequency comparator (PFD) 1 accepts, as input signals, a reference signal (FREF) 8 and a feedback signal (FB) 9, and outputs a first output signal (UP) 11 and a second output signal (DN) 12 as phase comparison output signals.

The PLL circuit integrated in on-chip style as in FIG. 1 particularly includes a controller (CNT) 7 according to an embodiment of the invention. The controller (CNT) 7 is supplied with a standby control signal (ST) 10. A control output signal $(OUT_{cnt})$ 17 produced by the controller (CNT) 7 and output through an output thereof is supplied to the second charge pump (CPS) 3. The standby control signal (ST) 10 is also supplied to the phase-frequency comparator (PFD) 1, the first charge pump (CPM) 2, the second charge pump (CPS) 3, the voltage-control oscillator (VCO) 5 and the divider (N) 6.

<<Characteristic of Low-Noise Steady Lock by On-Chip Loop Filter>>

FIG. 2 is a time chart showing an operation sequence of the standby state, high-speed lock response operation and low-noise steady lock operation of the PLL circuit integrated in on-chip style as in FIG. 1. In the drawing, the PLL circuit stays in the standby state from Time $T_0$ to Time $T_1$. The PLL circuit is in high-speed lock response operation from Time $T_1$ to Time $T_2$, and in low-noise steady lock operation after Time $T_2$.

After Time $T_2$ as in FIG. 2, in the PLL circuit of FIG. 1, in response to UP signal from the phase-frequency comparator (PFD) 1, i.e. the first output signal (UP) 11, and DOWN signal, i.e. the second output signal (DN) 12, the first and second charge pumps 2 and 3 work in the same way as the two charge pump circuits as described in JP-A-2005-184771 do. Specifically, the first and second charge pumps 2 and 3 operate in reverse to each other in phase in response to the UP and DOWN signals from the phase-frequency comparator (PFD) 1, provided that the charge/discharge current of the second charge pump 3 is set to be smaller than that of the first charge pump 2. For instance, the charge/discharge current of the first charge pump 2 is set to 100 microamperes, and that of the second charge pump 3 is set to 80 microamperes.

As a result, like the PLL circuit described in JP-A-2005-184771, as to the PLL circuit integrated in on-chip style as in FIG. 1, the filter capacitance of the loop filter (LF) 4 can be implemented on the chip depending on the current ratio of charge/discharge currents of the first and second charge pumps 2 and 3. At the time of so doing, setting the frequency bandwidth of the loop filter (LF) 4 to be relatively narrow, the low-noise characteristic can be achieved in a steady lock operation after Time $T_2$.

The operations of the first and second charge pumps 2 and 3 conducted with charge/discharge currents different in value therebetween and reverse to each other in phase in response to the outputs of the phase-frequency comparator (PFD) 1 are carried out as follows.

In case that the feedback signal (FB) 9 from the output of the divider (N) 6 is delayed in phase with respect to the reference signal (FREF) 8, the phase-frequency comparator (PFD) 1 produces a first output signal (UP) 11 as UP signal for putting the feedback signal (FB) 9 forward in phase. In response to the first output signal (UP) 11, which is UP signal, the first charge pump 2 strongly charges the loop filter (LF) 4, while the second charge pump 3 weakly discharges the loop filter (LF) 4. As a result, the voltage at an output node 15 (Vc)

of the loop filter (LF) 4 is raised. Thus, the oscillation frequency of the voltage-control oscillator (VCO) 5 is boosted in response to the rise of the voltage at the output node 15 (Vc), and the phase of the feedback signal (FB) 9 from the output of the divider (N) 6 is put forward to coincide with the phase of the reference signal (FREF) 8.

In case that the feedback signal (FB) 9 from the output of the divider (N) 6 leads the reference signal (FREF) 8 in phase, the phase-frequency comparator (PFD) 1 produces a second output signal (DN) 12 as DOWN signal for delaying the phase of the feedback signal (FB) 9. The first charge pump 2 strongly discharges the loop filter (LF) 4 in response to the second output signal (DN) 12, which is DOWN signal, while the second charge pump 3 weakly charges the loop filter (LF) 4. As a result, the voltage at the output node 15 (Vc) of the loop filter (LF) 4 is lowered. Thus, the oscillation frequency of the voltage-control oscillator (VCO) 5 is decreased in response to the lowering of the voltage at the output node 15 (Vc), and the phase of the feedback signal (FB) 9 from the output of the divider (N) 6 is delayed to coincide with the phase of the reference signal (FREF) 8.

<<Standby Mode of Low Power Consumption With Lock Operation Stopped>>

In the operation standby state between Time $T_0$ and Time $T_1$ in FIG. 2, the PLL circuit of FIG. 1 stays in a state that its lock operation is stopped.

As shown in FIG. 2, in the standby state between Time $T_0$ and Time $T_1$, a standby control signal (ST) 10 of High level is supplied to the phase-frequency comparator (PFD) 1, the first charge pump (CPM) 2, the second charge pump (CPS) 3, the voltage-control oscillator (VCO) 5, the divider (N) 6 and the controller (CNT) 7. As a result, the PLL circuit of FIG. 1 wholly stops locking, and the power consumption of the entire PLL circuit of FIG. 1 is cut. This makes it possible to make the life of a battery longer.

According to a preferred embodiment of the invention, in the standby state between Time $T_0$ and Time $T_1$ as in FIG. 2, the phase-frequency comparator (PFD) 1, the first charge pump (CPM) 2, the second charge pump (CPS) 3, and the divider (N) 6 are controlled to be put in a cutoff state and reduced in power consumption in response to the standby control signal (ST) 10 of High level. However, the operating current of the voltage-control oscillator (VCO) 5 is controlled to a lower level than normal. The voltage-control oscillator (VCO) 5 stays in the standby state, and continues self-running oscillation with a low power consumption. As a result, it becomes possible to increase the response of the PLL circuit of FIG. 1 at the time of transition from the standby state to the mode of high-speed lock response operation.

<<High-Speed Lock Response Operation>>

The operation from Time $T_1$ to Time $T_2$ of FIG. 2 corresponds to the high-speed lock response operation. The high-speed lock response operation is started at the time of termination of the standby state between $T_0$ and $T_1$.

Specifically, turning the standby control signal (ST) 10 from High level to Low level at Time $T_1$ makes the phase-frequency comparator 1, the first charge pump 2, the second charge pump 3, the voltage-control oscillator 5, the divider 6, and the controller 7 ready to start their circuit operations. However, even after the standby control signal (ST) 10 has been changed from High level to Low level at Time $T_1$, the controller 7 keeps supplying the control output signal (OUT$_{cnt}$) 17 of High level to the second charge pump (CPS) 3 between Time $T_1$ and $T_2$. The control output signal (OUT$_{cnt}$) 17 of High level serves as a signal to prohibit the second charge pump (CPS) 3 from working. Therefore, the second charge pump (CPS) 3 stops weakly discharging the loop filter (LF) 4 according to the output of the phase-frequency comparator 1 between Time $T_1$ and Time $T_2$.

Hence, in the high-speed lock response operation between Time $T_1$ to Time $T_2$, the first charge pump 2 strongly charges the loop filter (LF) 4 in response to UP signal (first output signal 11) of the phase-frequency comparator 1, whereas the second charge pump 3 remains stopped from weakly discharging the filter. As a result, the voltage at the output node 15 (Vc) of the loop filter (LF) 4 is raised sharply. Thus, high-speed lock by PLL can be achieved shortly after Time $T_2$ as shown by the characteristic curve L2 of FIG. 2. The high-speed lock time according to the characteristic curve L2 meets the required specification of ten microseconds for the serial ATA interface unit. Here, the characteristic curve L1 of FIG. 2 shows the characteristic of PLL clock in case that the second charge pump (CPS) 3 is not stopped from weakly discharging the loop filter (LF) 4 during the high-speed lock response operation between Time $T_1$ and Time $T_2$. As shown by the characteristic curve L1 of FIG. 2, PLL is not ready to lock until a considerable time has elapsed after Time $T_2$. The low-speed lock time according to the characteristic curve L1 cannot satisfy the required specification of ten microseconds for the serial ATA interface unit.

<<Loop Filter of PLL Circuit>>

In the PLL circuit of FIG. 1, a third-order lag-lead filter is used as the loop filter (LF) 4.

The loop filter (LF) 4 has a first resistance (R1) 18 and a first capacitance (C1) 19 connected in series with each other, in which the other end of the first capacitance (C1) 19 is connected to the ground potential. The second capacitance (C2) 21 is connected in parallel with a combination of the first resistance (R1) 18 and first capacitance (C1) 19 connected in series. The other end of the second capacitance (C2) 21 is connected to the ground potential.

One end of the second resistance (R2) 20 is connected to a connection node of the first resistance (R1) 18 and second capacitance (C2) 21, and the other end is connected to the third capacitance (C3) 22. The other end of the third capacitance (C3) 22 is connected to the ground potential.

At the output node 15 (Vc) to which the second resistance (R2) 20 and third capacitance (C3) 22 are connected, a control voltage Vc to be supplied to the voltage-control oscillator (VCO) 5 arises.

Charge and discharge output signals from the first charge pump 2 are supplied to a node 13 to which the first resistance (R1) 18, second capacitance (C2) 21 and second resistance (R2) 20 are connected. On the other hand, charge and discharge output signals from the second charge pump 3 are supplied to a node 14 to which the first resistance (R1) 18 and first capacitance (C1) 19 are connected.

The first capacitance (C1) 19 of the loop filter (LF) 4 converts charge/discharge currents from the first and second charge pumps 2 and 3 into charge and discharge voltages. The first resistance (R1) 18 is inserted to improve the phase margin on condition that the phase shift at a crossover frequency is 180 degrees or below. The second capacitance (C2) 21 reduces mismatch between charge current and discharge current from the first charge pump 2, mismatch between charge current and discharge current from the second charge pump 3, and ripple components owing to clock feedthrough from charge/discharge switches of the first and second charge pumps 2 and 3. A low-pass filter including the second resistance (R2) 20 and third capacitance (C3) 22 further reduces ripple components of a control voltage Vc arising at the output node 15 of the loop filter (LF) 4.

<<Control of First and Second Charge Pumps by Phase-Frequency Comparator>>

The first output signal (UP) 11 and second output signal (DN) 12 are input to the first charge pump 2 from the phase-frequency comparator 1, whereby strong charge and discharge actions on the loop filter (LF) 4 by the first charge pump are controlled. Specifically, the charge action is controlled according to the first output signal (UP) 11, and the discharge action is controlled according to the second output signal (DN) 12. On the other hand, the first output signal (UP) 11 and second output signal (DN) 12 are input to the second charge pump 3 in reverse in phase to those input to the first charge pump 2, whereby weak charge and discharge actions on the loop filter (LF) 4 by the second charge pump are controlled. Specifically, the charge action is controlled according to the second output signal (DN) 12, and the discharge action is controlled according to the first output signal (UP) 11. In other words, the charge action by the first charge pump 2 and the discharge action by the second charge pump 3 are controlled according to the first output signal (UP) 11; the discharge action by the first charge pump 2 and the charge action by the second charge pump 3 are controlled according to the second output signal (DN) 12.

<<Feedback of Output of Voltage-Control Oscillator by Divider>>

The voltage-control oscillator (VCO) 5, to which a control voltage 15 (Vc) is supplied, produces an output signal 16 having a frequency controlled by the control voltage 15 (Vc). The output signal 16 makes an output signal of the PLL circuit, and is input to the divider (N) 6. The divider (N) 6 executes a frequency division action for dividing in frequency the output signal 16 of the voltage-control oscillator (VCO) 5 according to the previously set frequency division ratio N. The resultant frequency-division output signal from the divider (N) is input to the other input terminal of the phase-frequency comparator (PFD) 1 as the feedback signal (FB) 9, and compared in phase with the reference signal (FREF) 8 input to the one input terminal of the phase-frequency comparator (PFD) 1.

<<Circuit Configuration of Charge Pump>>

Figure 3:
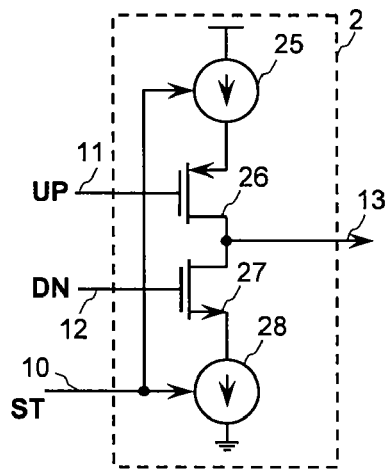
FIG. 3 is a diagram showing a circuit configuration of the first charge pump used in the PLL circuit integrated in on-chip style as in FIG. 1.

FIG. 3 is a diagram showing a circuit configuration of the first charge pump 2 used in the PLL circuit integrated in on-chip style as in FIG. 1.

The first charge pump 2 shown in FIG. 3 includes: a charging current source 25; a charge switch 26; a discharge switch 27; and a discharging current source 28. The charge current from the charging current source 25 and the discharge current from the discharging current source 28 are identical in current value. The charge switch 26 is controlled with UP signal 11 and the discharge switch 27 is controlled with DN signal 12.

In the standby state, the charge and discharge currents of the charging current source 25 and discharging current source 28 are controlled by the standby signal (ST) 10 of High level to be zero. In the high-speed lock response operation and low-noise steady lock operation, the charge switch 26 is controlled and put in ON state by UP signal, i.e. the first output signal (UP) 11 at the time of charging. As a result, the charge current from the charging current source 25 is output through the node 13, whereby the filter capacitance is charged with an electric charge. In contrast, at the time of discharging, the discharge switch 27 is controlled and put in ON state by DOWN signal, i.e. the second output signal (DN) 12, and thus the discharge current from the discharging current source 28 causes the charge of the filter capacitance to be discharged through the node 13.

Figure 4A:
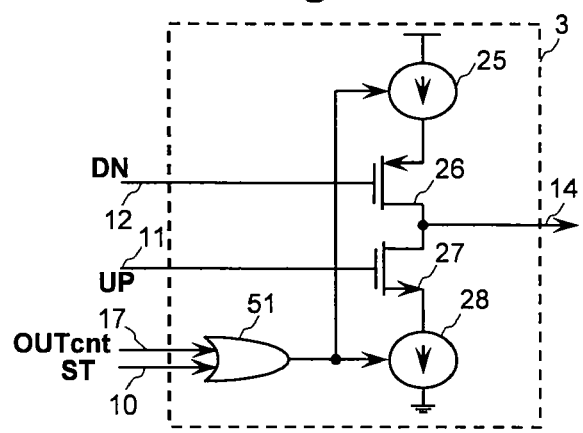
FIGS. 4A and 4B are each a diagram showing a circuit configuration of the second charge pump used in the PLL circuit integrated in on-chip style as in FIG. 1.
Figure 4B:
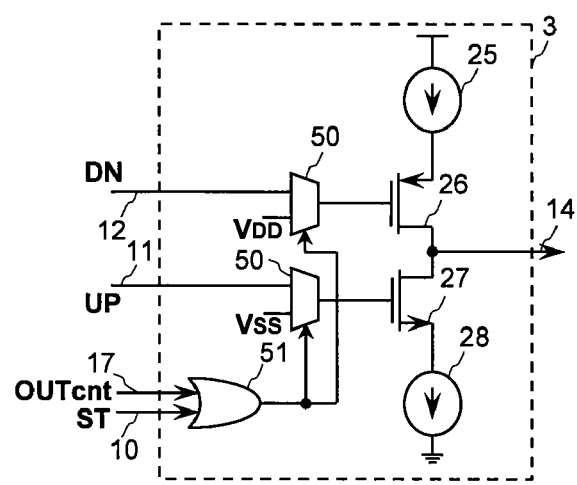

FIGS. 4A and 4B are each a diagram showing a circuit configuration of the second charge pump 3 used in the PLL circuit integrated in on-chip style as in FIG. 1.

FIG. 4A presents the first circuit configuration of the second charge pump 3. The second charge pump 3 shown in FIG. 4A includes a charging current source 25, a charge switch 26, a discharge switch 27, a discharging current source 28, and an OR circuit 43. The charge and discharge actions by the second charge pump 3 of FIG. 4A are equivalent to those by the first charge pump 2 of FIG. 3. Hence, the description of the charge and discharge actions is omitted here. The second charge pump 3 of FIG. 4A works only in the low-noise steady lock operation when the standby signal (ST) 10 and control output signal ($OUT_{cnt}$) 17 are both at Low level, the action of which is controlled by an output resulting from logic OR operation of the standby signal (ST) 10 and control output signal ($OUT_{cnt}$) 17.

FIG. 4B presents the second circuit configuration of the second charge pump 3. The second charge pump 3 shown in FIG. 4B includes a charging current source 25, a charge switch 26, a discharge switch 27, a discharging current source 28, a pair of selectors 50, and an OR logic (OR) 51. The second charge pump 3 works only when the standby signal (ST) 10 and control output signal ($OUT_{cnt}$) 17 are both at Low level, the action of which is controlled by an output resulting from logic OR operation of the standby signal (ST) 10 and control output signal ($OUT_{cnt}$) 17. First, the standby state is actualized by turning OFF the charge switch 26 and discharge switch 27. In case that the standby signal (ST) 10 and control output signal ($OUT_{cnt}$) 17 are both at High level, the selector 50 connected with the charge switch 26 selects a source voltage VDD, and the selector 50 connected with the discharge switch 27 selects the ground potential Vss, whereby the charge switch 26 and discharge switch 27 are turned OFF. In contrast, that the standby signal (ST) 10 and control output signal ($OUT_{cnt}$) 17 are both at Low level, the low-noise steady lock operation is brought into effect. Then, the selector 50 connected with the charge switch 26 selects DOWN signal, i.e. the second output signal (DN) 12, and the selector 50 connected with the discharge switch 27 selects UP signal, i.e. the first output signal (UP) 11.

<<Alternative Loop Filter of PLL Circuit>>

In the PLL circuit of FIG. 1, a third-order lag-lead filter is used as the loop filter (LF) 4.

Figure 5:
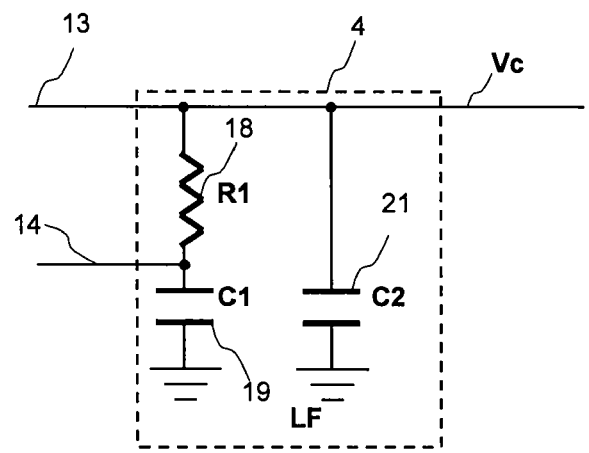
FIG. 5 is a diagram showing a circuit configuration of another loop filter which can be used for the PLL circuit integrated in on-chip style as in FIG. 1.

FIG. 5 is a diagram showing a circuit configuration of an alternative loop filter (LF) 4 which can be used for the PLL circuit integrated in on-chip style as in FIG. 1. The alternative loop filter (LF) 4 shown in FIG. 5 is formed as a second-order filter by omitting the second resistance (R2) 20 and third capacitance (C3) 22 from the loop filter (LF) 4 of the PLL circuit of FIG. 1.

<<Controller>>

In the PLL circuit integrated in on-chip style as in FIG. 1, the controller (CNT) 7 produces the time difference between Time $T_1$ when the standby control signal (ST) 10 is turned from High level to Low level and Time $T_2$ when the control output signal ($OUT_{cnt}$) 17 is turned from High level to Low level as in the operation sequence shown in FIG. 2. The time difference between Time $T_1$ and Time $T_2$ corresponds to a term during which the high-speed lock response operation of the PLL circuit integrated in on-chip style as in FIG. 1 is in effect.

In an embodiment of the invention, the controller (CNT) 7 responds to the change of the standby control signal (ST) 10 at Time $T_1$ from High to Low level behind thereby to produce a control output signal ($OUT_{cnt}$) 17 which changes from High to Low level at Time $T_2$.

Figure 6:
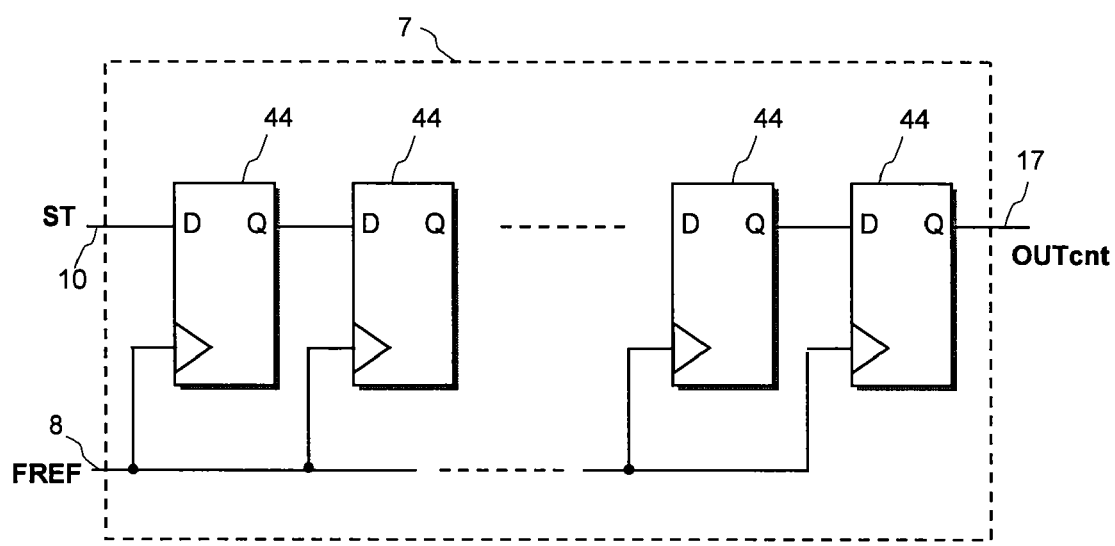
FIG. 6 is a diagram showing a configuration of the controller which responds to the change of the standby control signal from High to Low level behind thereby to produce a control output signal changing from High to Low level in the PLL circuit integrated in on-chip style as in FIG. 1.

FIG. 6 is a diagram showing a configuration of the controller (CNT) 7 which responds to the change of the standby control signal (ST) 10 from High to Low level behind thereby to produce a control output signal ($OUT_{cnt}$) 17 changing from High to Low level in the PLL circuit integrated in on-chip style as in FIG. 1.

The controller (CNT) 7 of FIG. 6 includes flip-flops 44 of multiple stages connected in series. The standby control signal (ST) 10 is supplied to a data input D of the first-stage flip-flop 44. A data output Q from each flip-flop 44 of the preceding stage is supplied to a data input D of the flip-flop 44 of the subsequent stage. To clock inputs of the flip-flops 44 of the first to last stages, the reference signal (FREF) 8 is supplied as a clock operation signal for delayed response operation commonly. The time difference between Time $T_1$ and Time $T_2$ in the operation sequence shown in FIG. 2 is determined by the sum of the delay times in the flip-flops 44 of the respective stages. It is noted that FIG. 6 presents an example showing the circuit configuration of the controller (CNT) 7 merely, and such controller can be realized by another circuit configuration having the same function of delaying a signal.

<<Fractional PLL Circuit>>

FIG. 7 is a diagram showing a configuration of a fractional PLL circuit included in a spread spectrum clock generator (SSCG) used in a serial ATA interface unit.

The fractional PLL circuit shown in FIG. 7 has a signal waveform generator module (SWG) 24 and a modulator (ΣΔ-MOD) 23 in addition to the PLL circuit integrated in on-chip style as in FIG. 1.

The signal waveform generator module (SWG) 24 produces a modulated signal to output the signal to the modulator (ΣΔMOD) 23. The modulator (ΣΔMOD) 23 converts the modulated signal into a discrete value as an instantaneous division factor. What is preferable as the modulator (ΣΔ-MOD) 23 is e.g. a delta sigma modulator. However, the modulator (ΣΔMOD) 23 is not so limited. The frequency division ratio of the divider (N) 6 which an output signal from the modulator (ΣΔMOD) 23 is supplied to is periodically changed from an integer N to another integer N+1. Consequently, the average frequency division ratio thereof is given by the sum of an integer part and a decimal part.

Figure 8:
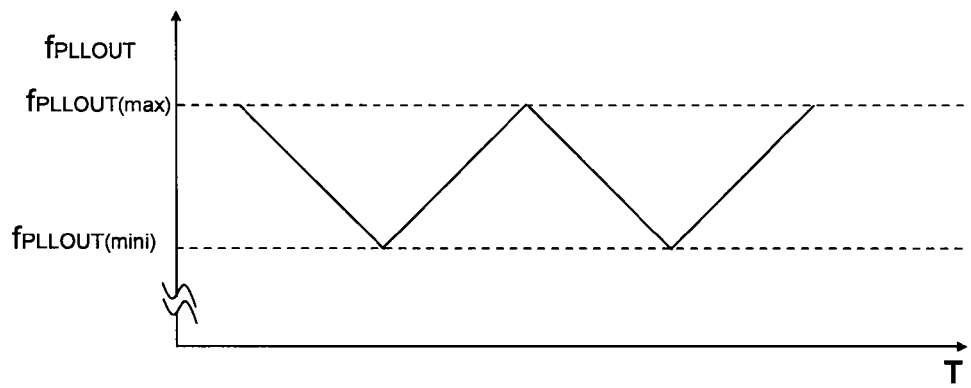
FIG. 8 is a diagram showing how the frequency of a PLL output signal produced by the fractional PLL circuit included in the spread spectrum clock generator shown in FIG. 7 varies with time.

FIG. 8 is a diagram showing how the frequency $f_{PLLOUT}$ of a PLL output signal produced by the fractional PLL circuit included in the spread spectrum clock generator (SSCG) shown in FIG. 7 varies with time.

As shown in the drawing, the frequency $f_{PLLOUT}$ of a PLL output signal subjected to frequency modulation by the sigma delta modulator (ΣΔMOD) is changed between a maximum value $f_{PLLOUT}$ (max) and a minimum value $f_{PLLOUT}$ (mini) linearly. The amount of change between the maximum value $f_{PLLOUT}$ (max) and minimum value $f_{PLLOUT}$ (mini) is, for example, about 0.5 to 5% of the maximum value $f_{PLLOUT}$ (max).

FIG. 9 is a diagram showing frequency spectra of the PLL output signal produced by the fractional PLL circuit included in the spread spectrum clock generator (SSCG) shown in FIG. 7.

From the characteristic curve SSCG of FIG. 9 it is shown that a PLL output signal produced as a system clock signal by the fractional PLL circuit included in the spread spectrum clock generator (SSCG) shown in FIG. 7 is spread over a wide frequency bandwidth, and thus the peak energy can be reduced. The characteristic curve Non-SSCG of FIG. 9 shows a frequency characteristic of a typical clock generator having an extremely high peak energy.

In addition, the spread spectrum clock generator (SSCG) shown in FIG. 7 has the controller (CNT) 7 control the action of the second charge pump 3. Thus, while keeping the functions in connection with output jitter, EMI reduction, etc., which is important for a spread spectrum clock generator, the generator enables large shortening of the setting time, and on-chip formation of the loop filter (LF) 4.

<<Interface Unit>>

FIG. 10 is a diagram showing a configuration of an interface unit according to another embodiment of the invention, which is connected between a peripheral device and a host computer.

As for the serial ATA type interface unit of FIG. 10, the fractional PLL circuit as shown in FIG. 7 is adopted as a first PLL circuit (41) and a second PLL circuit (40).

In a process that a peripheral device reads data from an optical disk, the serializer (SER) 39 serving as a parallel-to-serial converter converts parallel transmission data from the record-and-reproduction unit (34) into serial transmission signals in synchronization with clocks supplied from the second PLL circuit (40), and outputs the signals to a host computer (32).

In a process that the peripheral device writes data into an optical disk, the clock data reproduction unit (38) accepts a receive signal from the host computer (32), responds to a clock supplied from the first PLL circuit (41) to produce serial reproduction data and reproduction clocks, and outputs them to the deserializer (DES) 37. The deserializer (DES) 37 serving as a serial-to-parallel converter converts produces parallel receive data from serial reproduction data and a reproduction clock, and then a process to write the data into the optical disk is executed.

Now, the serial ATA type interface unit shown in FIG. 10 will be described below in detail.

In general, there have been e.g. serial ATA type interface units pursuant to standards as an interface to connect storage media (peripheral devices) such as an optical disk device and a hard disk drive to a computer such as a personal computer. Use of a serial ATA allows various kinds of storage media to be connected to a computer by means of the control of a compatible command or control software program. As to the interface unit shown in FIG. 10, an optical disk device is adopted as a storage medium, and the peripheral device is connected to the host computer by the serial ATAPI. ATAPI is an abbreviation for "Advanced Technology Attachment Peripheral Interface".

The optical disk device in FIG. 10 includes an optical disk 29, an optical pickup 30, a semiconductor integrated circuit 31, and a crystal oscillator 33 which supplies a reference signal. The optical disk device is connected to the host computer (HOST) 32 according to the serial ATAPI scheme.

The optical pickup 30 irradiates the optical disk 29 with a light beam to read and write data. The semiconductor integrated circuit 31 includes: a record-and-reproduction unit (READ/WRITE) 34 which has the optical pickup 30 write and read data; and an interface unit (ATAPI) 36 for inputting/outputting data of the record-and-reproduction unit 34 to/from the host computer (HOST) 32.

The interface unit (ATAPI) 36 includes the serializer (SER) 39, first PLL circuit 41, second PLL circuit 40, deserializer (DES) 37 and clock data reproduction unit (CDR) 38.

In a process to read data from the optical disk 29, the serializer (SER) 39 of the interface unit (ATAPI) 36 converts parallel transmission data from the record-and-reproduction unit 34 into serial transmission signals (TX) in synchronization with a clock (CLK) supplied from the second PLL circuit (40) to output the signals to the host computer 32.

In a process to write data into the optical disk 29, the clock data reproduction unit (CDR) 38 of the interface unit (ATAPI) 36 accepts receive signals (RX) from the host computer 32, responds to a clock (CLK) supplied from the first PLL circuit 41 to produce serial reproduction data (DATA) and reproduction clocks (CLK), and outputs them to the deserializer (DES) 37. The deserializer (DES) 37 produces parallel receive data from the serial reproduction data (DATA) and reproduction clocks (CLK), and outputs them to the record-and-reproduction unit 34. Then, the process of data writing on the optical disk 29 is performed.

As to the serial ATA type interface unit of FIG. 10, the fractional PLL circuit as shown in FIG. 7 is adopted for the first and second PLL circuits 41 and 40. The reference signal (FREF) 8 input to the first and second PLL circuits 41 and 40 is supplied from the crystal oscillator 33 with its oscillation frequency maintained stable.

The semiconductor integrated circuit 31 is controlled to be either in a standby state (sleep mode) or in an access operation mode (active mode) according to a power switch signal 43 produced in response to a user operation on a power switch. In the semiconductor integrated circuit 31, when the power switch signal 43 is supplied to the control register 35, the standby control signal (ST) 42 is output from the control register 35 and supplied to the interface unit (ATAPI) 36. The interface unit (ATAPI) 36 makes a judgment on whether to put the semiconductor integrated circuit 31 in the standby state (sleep mode) or access operation mode (active mode) in response to the standby control signal (ST) 42 of High or Low level.

Particularly, adopting the fractional PLL circuit as shown in FIG. 7 as the first and second PLL circuits 41 and 40 of the interface unit (ATAPI) 36 enables on-chip formation of the loop filter (LF) 4, and therefore makes it possible to offer a semiconductor integrated circuit 31 at a lower cost.

Further, as the first and second PLL circuits (41, 40) can make shorter the settling time, it becomes possible to speed up the transition of operation from the standby state (sleep mode) to the access operation mode (active mode).

In addition, the first and second PLL circuits (41, 40) can be put in the condition of low power consumption in the standby state (sleep mode). Consequently, it becomes possible to greatly reduce the current which the interface unit (ATAPI) 36 expends and therefore the semiconductor integrated circuit 31 consumes in the standby state.

<<Record-and-Reproduction Unit>>

FIG. 11 is a diagram showing a configuration of a record-and-reproduction unit according to another embodiment of the invention, which is connected between a peripheral device and a host computer.

As to the record-and-reproduction unit (34) of FIG. 11, the fractional PLL circuit integrated in on-chip style as shown in FIG. 1 is used as a PLL circuit (46) for producing a clock used in a process of data write.

In a process that a peripheral device writes data into an optical disk, the write logic circuit (45) responds to write data from the host 32 and the write clock signal from the PLL circuit 46 to produce write signals and outputs them to the optical pickup 30.

Now, the record-and-reproduction unit shown in FIG. 11 will be described below in detail.

As in FIG. 11, the optical disk device includes an optical disk 29, an optical pickup 30, a semiconductor integrated circuit 49 and a crystal oscillator 33 which supplies a reference signal. The optical disk device is connected to the host computer (HOST) 32 according to the serial ATAPI scheme.

The optical pickup 30 irradiates the optical disk 29 with a light beam to read and write data. The semiconductor integrated circuit 49 includes: a record-and-reproduction unit (READ/WRITE) 34 which has the optical pickup 30 write and read data; and an interface unit (ATAPI) 36 for inputting/outputting data of the record-and-reproduction unit 34 to/from the host computer (HOST) 32. The serial ATA type interface unit (ATAPI) 36 of FIG. 11 can be constructed absolutely in the same way as the interface unit (ATAPI) 36 shown in FIG. 10.

Further, the record-and-reproduction unit (READ/WRITE) 34 of the semiconductor integrated circuit 49 of FIG. 11 includes a write logic circuit (LOGIC) 45, a PLL circuit 46, a read logic circuit (LOGIC) 47 and a PRML timing circuit 48. Particularly, the read logic circuit (LOGIC) 47 and PRML timing circuit 48 constitute a PRML decoder for read. Here, PRML is an abbreviation for "Partial Response Mostly Likelihood", which is a decoding technique.

In a process that data is written into the optical disk 29, the write logic circuit 45 receives write data supplied through the interface unit (ATAPI) 36 from the host computer (HOST) 32. The write logic circuit 45 responds to the write data and a write clock signal supplied from the PLL circuit 46 to produce write signals and outputs them to the optical pickup 30.

Particularly, adopting the fractional PLL circuit integrated in on-chip style as shown in FIG. 1 as the PLL circuit (46) which produces a clock for the data write process by the record-and-reproduction unit (READ/WRITE) 34 enables on-chip formation of the loop filter (LF) 4, whereby it becomes possible to provide the semiconductor integrated circuit 49 at a lower cost. Further, as the PLL circuit (46) which produces a clock for the data write process can make shorter the settling time, it becomes possible to speed up the transition of operation from the standby state (sleep mode) to the access operation mode (active mode).

In addition, the PLL circuit (46) which produces a clock for the data write process can be put in the condition of low power consumption in the standby state (sleep mode). Consequently, it becomes possible to greatly reduce the current which the record-and-reproduction unit (READ/WRITE) 34 expends and therefore the semiconductor integrated circuit 49 consumes in the standby state.

While the invention made by the inventor has been specifically described above based on the embodiments, the invention is not so limited. It is needless to say that various modifications and changes may be made without departing from the subject matter hereof.

For example, in the above-described embodiments, the control of switching of the operation mode of the PLL circuit from the standby state to high-speed lock mode is performed by the change of the standby control signal (ST) 10 from High to Low level. The control of switching of the operation mode of the PLL circuit from the high-speed lock mode to low-noise steady lock mode is executed by the change of the control output signal ($OUT_{cnt}$) 17 formed by delay of the standby control signal (ST) 10 from High to Low level.

The invention is not limited to the embodiment like this. It may be arranged so that when a reference signal (FREF) 8 having an amplitude over a predetermined reference level is supplied to the one input terminal of the phase-frequency comparator (PFD) 1, the operation mode of the PLL circuit is switched from the standby state to the high-speed lock mode. A control signal for such switching may be formed from an output of a detector circuit to which the reference signal (FREF) 8 accepted through the one input terminal of the phase-frequency comparator (PFD) 1 is supplied. The control of switching of the operation mode of the PLL circuit from the high-speed lock mode to the low-noise steady lock mode may be executed by a control output signal formed by delaying an output signal of the detector circuit.

In the PLL circuit according to the above-described embodiment, the second charge pump (CPS) 3 is controlled to be in the state of being prohibited from working by the control output signal (OUT$_{cnt}$) 17 of High level, and the weak discharge action on the loop filter (LF) 4 by the second charge pump (CPS) 3 is at a standstill during the high-speed lock response operation between Time T$_1$ and Time T$_2$.

However, the invention is not limited to the embodiment. During the high-speed lock response operation between Time T$_1$ and Time T$_2$, the first and second charge pumps (CPM, CPS) 2 and 3 may charge and discharge the loop filter (LF) 4 in the same phase in response to the output from the phase-frequency comparator (PFD) 1. In this time, the first and second charge pumps 2 and 3 may perform charge and discharge actions with currents of the same value and the same phase during the high-speed lock response operation between Time T$_1$ and T$_2$, unlike a case that the first and second charge pumps 2 and 3 perform charge and discharge actions with currents different in value and reverse to each other in phase during the low-noise steady lock operation after Time T$_2$. As a result, the high-speed lock response operation between the Time T$_1$ and Time T$_2$ can be speeded up further.

In the embodiment described above, a combination of an optical disk device on the storage media side and a host computer on the host side is adopted. However, the invention is not limited to such combination. For example, a combination of a hard disk drive (HDD) on the storage media side and a network server on the host side may be arranged.

Further, as another storage medium, disks of large storage capacity including DVD (Digital Versatile Disk) and BD (Blue-ray Disk) may be used.

What is claimed is:

1. A semiconductor integrated circuit comprising a phase-locked loop circuit including:
   a phase frequency comparator;
   a first charge pump;
   a second charge pump;
   a loop filter;
   a voltage-control oscillator; and
   a divider,
   wherein the phase-frequency comparator compares a reference signal with a feedback signal made by an output signal of the divider in phase difference, and produces first and second output signals as phase comparison output signals resulting from the comparison,
   wherein the first and second charge pumps are made operable to charge and discharge the loop filter in response to the first and second output signals from the phase-frequency comparator respectively,
   wherein outputs of the first and second charge pumps are connected to the loop filter,
   wherein an operation mode of the PLL circuit includes a standby state in which a locking operation is stopped, a lock response operation in which the locking operation is started, and a steady lock operation in which the locking operation started by the lock response operation is continued,
   wherein, in the steady lock operation of the PLL circuit in which a phase of the reference signal and a phase of the feedback signal from the divider are kept in a state of being locked in a predetermined relation, setting is made so that charge/discharge current of the output of the second charge pump is smaller than charge/discharge current of the output of the first charge pump in current value,
   wherein, in the operation mode of the steady lock operation of the PLL circuit, the first and second charge pumps each carry out a charge/discharge operation of the loop filter in opposite phases with respect to each other in response to the first and second output signals of the phase-frequency comparator,
   wherein, the lock response operation in which the locking operation is started, the second charge pump is stopped from performing the charge/discharge operation of the loop filter which is an opposite phase as that of the charge/discharge operation of the loop filter by the first charge pump,
   wherein, in the standby state of the operation mode of the PLL circuit, at least the phase-frequency comparator, the first and second charge pumps, and the divider of the PLL circuit are controlled to be in cutoff states,
   wherein a control signal for changing the operation mode of the PLL circuit from the standby state to the lock response operation is supplied to the PLL circuit,
   wherein at least the phase-frequency comparator, the first charge pump and the divider of the PLL circuit are released from the cutoff states and start operating in response to supply of the control signal to the PLL circuit,
   wherein the PLL circuit further includes a controller which produces a control output signal changing in level behind by a predetermined delay time in response to a change in level of the control signal, and
   wherein, in response to a change in a level of the control output signal produced by the controller, said stopping of the charge/discharge operation of the loop filter by the second charge pump which is the opposite phase as that of the charge/discharge operation of the loop filter by the first charge pump is terminated, and the charge/discharge operation by the second charge pump is started in the steady lock operation.

2. The semiconductor integrated circuit according to claim 1,
   wherein the PLL circuit further includes a modulator connected to the divider, and
   wherein the divider varies in division factor between difference values in response to an output of the modulator, and thus the PLL circuit operates, as a fractional PLL in which an average division factor of the divider is constituted by a sum of an integer part and a decimal part, in a fractional PLL operation mode.

3. The semiconductor integrated circuit according to claim 2, further comprising:
   an on-chip serial ATA interface unit,
   wherein the PLL circuit which operates in the fractional PLL operation mode constitutes a spread spectrum clock generator used in the on-chip serial ATA interface unit.

4. The semiconductor integrated circuit according to claim 3,
   wherein the semiconductor integrated circuit including the serial ATA interface unit is adapted to be connected between a storage disk device and a host device, and
   wherein the semiconductor integrated circuit reads a read signal from the storage disk device to supply the read data to the host device, and accepts write data from the host device to supply a write signal to the storage disk device.

5. The semiconductor integrated circuit according to claim 4,
wherein the first and second output signals of the phase-frequency comparator are supplied to charge and discharge control input terminals of the first charge pump respectively, and
wherein the second and first output signals of the phase-frequency comparator are supplied to charge and discharge control input terminals of the second charge pump, respectively.

6. The semiconductor integrated circuit according to claim 5,
wherein outputs of the first and second charge pumps are respectively connected to one end of a resistance of the loop filter and the other end of the resistance, and
wherein a capacitance is connected between the other end of the resistance and a ground potential.

7. The semiconductor integrated circuit according to claim 1,
wherein in the lock response operation in which the lock operation is started, the first and second charge pumps charge and discharge the loop filter in phase with each other.

8. A semiconductor integrated circuit for interface connectable between a storage disk device and a host device, comprising:
a record-and-reproduction unit arranged to be connectable with the storage disk device and including a first PLL circuit; and
an interface unit arranged to be connectable with the host device and including second PLL circuits,
wherein the semiconductor integrated circuit reads a read signal from the storage disk device to supply read data to the host device, and accepts write data from the host device to supply a write signal to the storage disk device,
wherein the record-and-reproduction unit of the semiconductor integrated circuit reads the read signal from the storage disk device to supply the write signal to the storage disk device,
wherein the interface unit of the semiconductor integrated circuit accepts the write data from the host device to supply the write signal to the storage disk device,
wherein the first PLL circuit and second PLL circuits each include a phase-frequency comparator, first and second charge pumps, a loop filter, a voltage-control oscillator and a divider,
wherein the phase-frequency comparator of each PLL circuit compares a reference signal with a feedback signal made by an output signal of the divider in phase difference, and outputs first and second output signals as phase comparison output signals resulting from the comparison,
wherein the first and second charge pumps of each PLL circuit are made operable to charge and discharge the loop filter in response to the first and second output signals from the phase-frequency comparator respectively,
wherein outputs of the first and second charge pumps of each PLL circuit are connected to the loop filter,
wherein an operation mode of each PLL circuit includes a standby state in which a locking operation is stopped, a lock response operation in which the locking operation is started, and a steady lock operation in which the locking operation started by the lock response operation is continued,
wherein, in the steady lock operation of each PLL circuit, in which a phase of the reference signal and a phase of the feedback signal from the divider are kept in a state of being locked in a predetermined relation, setting is made so that charge/discharge current of the output of the second charge pump is smaller than charge/discharge current of the output of the first charge pump in current value,
wherein, in the operation mode of the steady lock operation of each PLL circuit, the first and second charge pumps each carry out a charge/discharge operation of the loop filter in opposite phases with respect to each other in response to the first and second output signals of the phase-frequency comparator,
wherein, in the lock response operation of each PLL circuit in which the locking operation is started, the second charge pump is stopped from performing the charge/discharge operation of the loop filter which is the opposite phase as that of the charge/discharge operation of the loop filter by the first charge pump,
wherein the second PLL circuits each include a modulator connected with the divider thereof, and
wherein the divider of the second PLL circuit varies in division factor between difference values in response to an output of the modulator, and thus the second PLL circuit operates as a fractional PLL in which an average division factor of the divider is constituted by a sum of an integer part and a decimal part, in a fractional PLL operation mode.

9. The semiconductor integrated circuit according to claim 8,
wherein, in the standby state of the operation mode of each PLL circuit, at least the phase-frequency comparator, the first and second charge pumps and the divider of the PLL circuit are controlled to be in cutoff states,
wherein a control signal for changing the operation mode of each PLL circuit from the standby state to the lock response operation is supplied to the PLL circuit;
wherein at least the phase-frequency comparator, the first charge pump and the divider of each PLL circuit are released from the cutoff states and start operating in response to supply of the control signal to the PLL circuit,
wherein each PLL circuit further includes a controller which produces a control output signal changing in level behind by a predetermined delay time in response to a change in a level of the control signal, and
wherein, in each PLL circuit, in response to a change in the level of the control output signal produced by the controller, said stopping of the charge/discharge operation of the loop filter by the second charge pump which is the opposite phase as that of the charge/discharge operation of the loop filter by the first charge pump is terminated, and the charge/discharge operation by the second charge pump is started in the steady lock operation.

10. The semiconductor integrated circuit according to claim 9,
wherein the first and second output signals of the phase-frequency comparator are supplied to charge and discharge control input terminals of the first charge pump of each PLL circuit, respectively, and
wherein the second and first output signals of the phase-frequency comparator are supplied to charge and discharge control input terminals of the second charge pump of each PLL circuit respectively.

11. The semiconductor integrated circuit according to claim 10, wherein outputs of the first and second charge pumps of each PLL circuit are respectively connected to one end of a resistance of the loop filter, and the other end of the resistance, and wherein a capacitance is connected between the other end of the resistance and a ground potential.

12. The semiconductor integrated circuit according to claim 9, further comprising:

a spread spectrum clock generator used in the interface unit arranged as a serial ATA interface unit, wherein the spread spectrum clock generator includes the second PLL circuits.

13. The semiconductor integrated circuit according to claim 9, wherein in the lock response operation in which locking is started, the first and second charge pumps charge and discharge the loop filter in phase with each other.

* * * * *